(12) United States Patent
Tsuji (10) Patent No.: US 6,606,195 B2
(45) Date of Patent: *Aug. 12, 2003

(54) OPTICAL UNIT AND OPTICAL INSTRUMENT HAVING THE SAME

(75) Inventor: Toshihiko Tsuji, Utsunomiya (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/411,633

(22) Filed: Oct. 1, 1999

(65) Prior Publication Data

US 2002/0048085 A1 Apr. 25, 2002

(30) Foreign Application Priority Data

Oct. 2, 1998 (JP) .......... 10-281296
Sep. 17, 1999 (JP) .......... 11-264446

(51) Int. Cl.⁷ .......... G02B 27/44; G02B 27/00
(52) U.S. Cl. .......... 359/566; 359/601; 359/614; 359/896; 347/241
(58) Field of Search .......... 359/566, 558, 359/562, 565, 601, 614, 896; 347/241, 239, 244; 356/51; 250/235, 461.1; 136/255

(56) References Cited

U.S. PATENT DOCUMENTS

| | | | |
|---|---|---|---|
| 3,630,617 A | * 12/1971 | Marrett .......... | 356/72 |
| 4,626,613 A | * 12/1986 | Wenham et al. .......... | 136/255 |
| 4,916,319 A | * 4/1990 | Telfair et al. .......... | 250/461.1 |
| 5,018,832 A | * 5/1991 | Terunuma et al. .......... | 359/601 |
| 5,270,794 A | 12/1993 | Tsuji et al. .......... | 356/371 |
| 5,432,603 A | 7/1995 | Sentoku et al. .......... | 356/349 |
| 5,461,474 A | 10/1995 | Yoshii et al. .......... | 356/237 |
| 5,486,919 A | 1/1996 | Tsuji et al. .......... | 356/349 |
| 5,523,562 A | * 6/1996 | Maple .......... | 250/235 |
| 5,585,918 A | 12/1996 | Takeuchi et al. .......... | 356/237 |
| 5,591,985 A | 1/1997 | Tsuji et al. .......... | 250/559.45 |
| 5,748,222 A | * 5/1998 | Roberts .......... | 347/241 |
| 5,751,426 A | 5/1998 | Nose et al. .......... | 356/356 |
| 5,767,962 A | 6/1998 | Suzuki et al. .......... | 356/237 |
| 5,861,952 A | 1/1999 | Tsuji et al. .......... | 356/349 |

* cited by examiner

Primary Examiner—Audrey Chang
(74) Attorney, Agent, or Firm—Fitzpatrick, Cella, Harper & Scinto (57) ABSTRACT

An optical unit includes an optical element for propagating incident light toward a predetermined direction, a barrel for supporting the optical element, and an attenuating device including a plurality of grooved portions, for attenuating, through multiple reflection, at least a portion of light emitted from the optical element toward a direction different from the predetermined direction. The attenuating device includes two recesses each having a horn-like section shape, the two recesses being bent in directions away from each other.

15 Claims, 10 Drawing Sheets

FIG. 13

OPTICAL UNIT AND OPTICAL INSTRUMENT HAVING THE SAME

FIELD OF THE INVENTION AND RELATED ART

This invention relates to an optical unit having an optical element such as a diffractive optical element, for example, and, more particularly, to an optical unit suitably usable in the manufacture of a microdevice such as an IC or LSI, for example.

Semiconductor device manufacturing technology has recently been advanced remarkably and, in this trend, microprocessing techniques have been developed significantly. For the microprocessing, reduction projection exposure apparatuses having a resolving power of submicron order and being called steppers are mainly used. For further improvement of resolution, enlargement of the numerical aperture (NA) of an optical system, shortening of exposure wavelength or introduction of a novel optical element has been attempted.

An optical element such as a diffractive optical element may be used in an exposure apparatus for correction of chromatic aberration, for example. On that occasion, among light rays diffracted by the optical element, those light rays (unwanted light) diffracted in directions other than a desired direction or directions may be reflected within a lens barrel, by which ghost or flare may be produced. This may cause non-uniformness of exposure amount distribution upon the surface to be exposed.

SUMMARY OF THE INVENTION

It is another object of the present invention to provide an optical instrument having such an optical unit as described above.

It is another object of the present invention to provide an optical instrument having such optical unit as described above.

In accordance with an aspect of the present invention, there is provided an optical unit, comprising: an optical element for deflecting light incident thereon toward different directions; and attenuating means for attenuating light deflected in a predetermined direction, of the different directions.

In accordance with another aspect of the present invention, there is provided an optical unit, comprising: means for holding an optical element being operable to deflect a portion of light incident thereon toward a predetermined direction and having a function that an unwanted light beam in another portion of the light incident thereon is directed in a direction different from the predetermined direction; and attenuating means operable to converge at least a portion of the unwanted light toward a predetermined region through multiple reflection, thereby to attenuate the same.

In one preferred form of these aspects of the present invention, there is cooling means for cooling said attenuating means.

The attenuating means may have a function for converging the light toward a predetermined region through multiple reflection.

The optical element may comprise a diffractive optical element.

The diffractive optical element may have a diffraction pattern formed with a step-like shape.

The light deflected toward the predetermined direction may be a positive first order or negative first order diffraction light of the light deflected by said optical element.

The attenuating means may comprise light absorbing means having a recess of horn-like sectional shape with its inside wall face formed as a reflection surface.

The attenuating means may comprise light absorbing means having a groove-like member with its side face formed as a reflection surface.

The optical element may be fixedly or movably held in a barrel, wherein said attenuating means may be provided over the whole circumference of the inside circumferential surface of said barrel.

The optical unit may have a plurality of light absorbing means.

The cooling means may comprise an air cooling system, a water cooling system, or a Peltier device.

In accordance with a further aspect of the present invention, there is provided an optical instrument having an optical unit as recited above, for projecting light to a photosensitive material through said optical unit.

In accordance with a yet further aspect of the present invention, there is provided an optical instrument having an optical unit as recited above, for projecting light to a photoelectric converting element through said optical unit.

In accordance with a still further aspect of the present invention, there is provided an exposure apparatus, comprising: an illumination optical system; a projection optical system; and an optical unit as recited above, wherein said optical unit is incorporated into one of said illumination optical system and said projection optical system as a portion thereof, so that a predetermined pattern is projected onto a surface to be illuminated, whereby the pattern is printed thereon.

In accordance with a yet further aspect of the present invention, there is provided a device manufacturing method, comprising the steps of: applying a photosensitive material to a wafer; exposing the wafer having the photosensitive material applied thereto, with a device pattern by use of an exposure apparatus; and developing the exposed wafer.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Preferred embodiments of the present invention will now be described with reference to the accompanying drawings.

Figure 1:
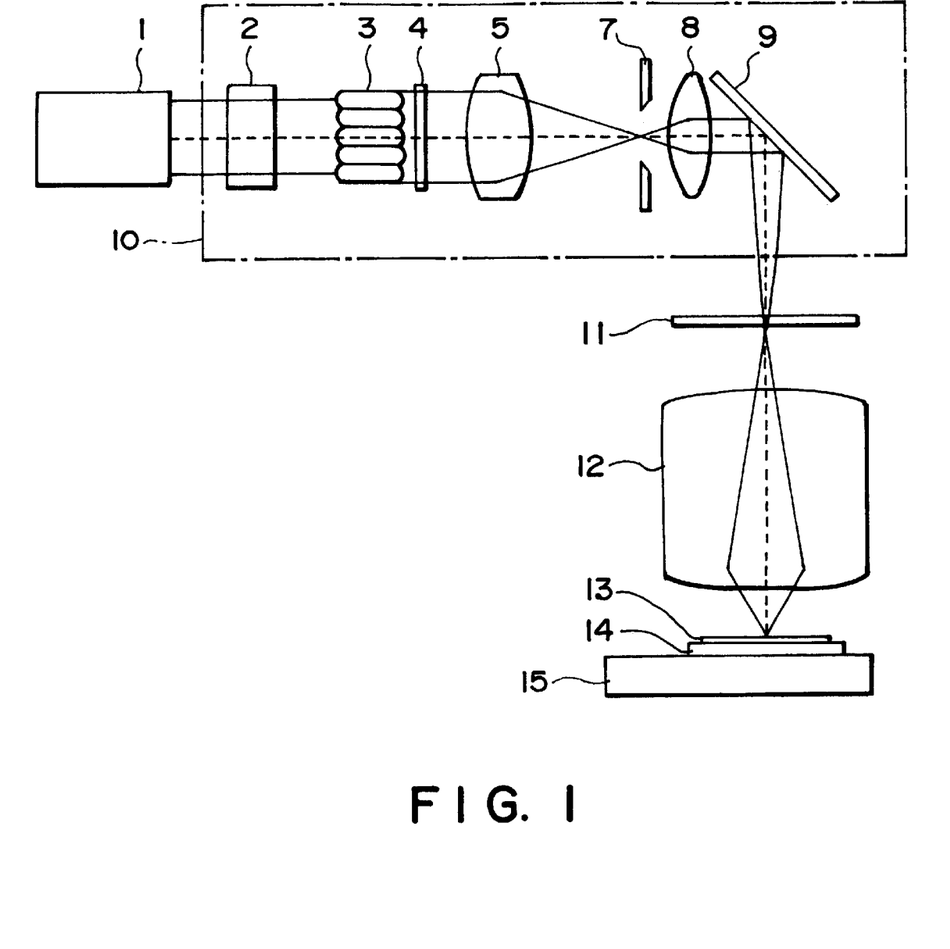
FIG. 1 is a schematic view of a general structure of a stepper according to a first embodiment of the present invention.
Figure 2:
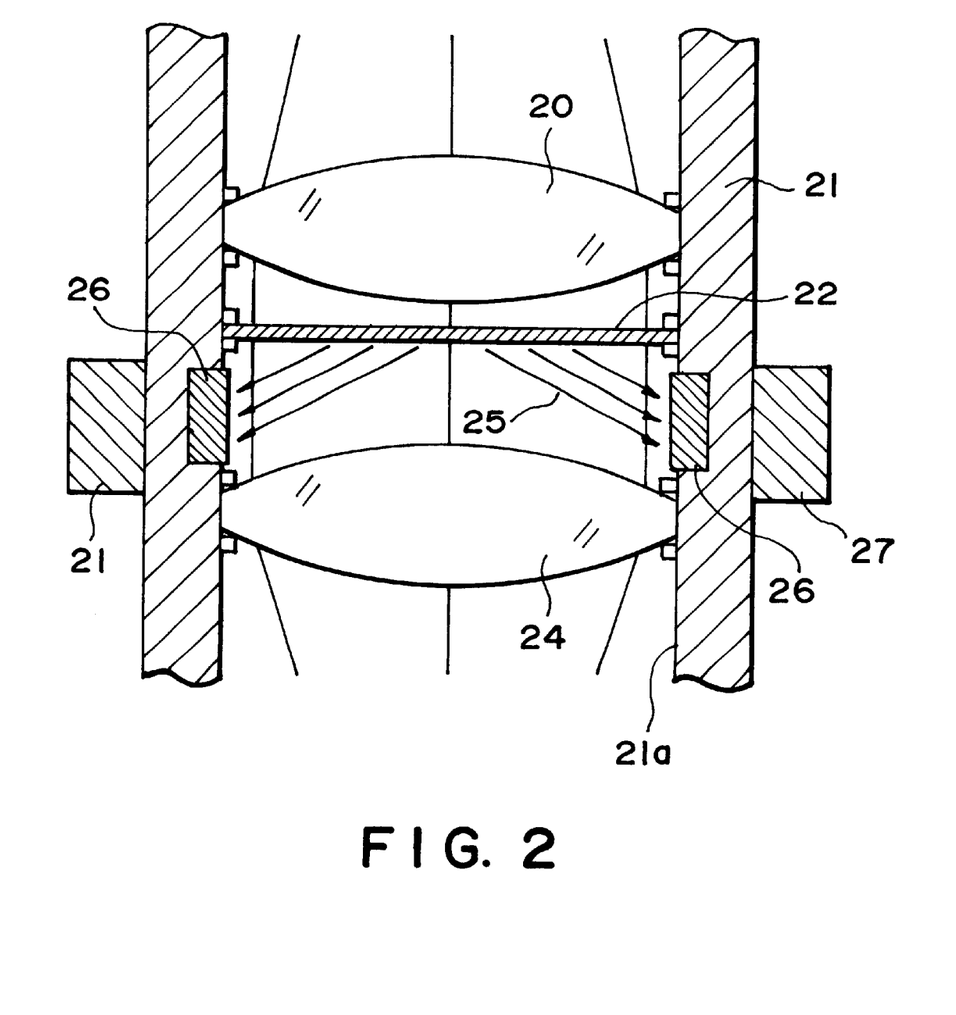
FIG. 2 is a schematic and sectional view of a portion of a reduction optical system according to an embodiment of the present invention.

FIG. 1 is a schematic and side view of a general structure of a stepper (reduction projection exposure apparatus) having an optical unit according to a first embodiment of the present invention. FIG. 2 is a schematic and sectional view of a portion of a projection optical system in the stepper of FIG. 1.

FIG. 1 is a schematic view which shows a major structure of the stepper of the first embodiment, wherein the stepper comprises an illumination optical system 10 for projecting an illumination light to a reticle 11 having a circuit pattern formed thereon, and a projection optical system 12 for projecting the pattern of the reticle 11 onto the surface of a wafer 13 in a reduced scale, by use of the light passing through the reticle 11. The stepper further comprises a wafer chuck 14 on which the wafer 13 is placed and held fixed, and a wafer stage 15 on which the wafer chuck 14 is fixedly mounted.

The optical system described above comprises a light source 1 for emitting illumination light of short-wavelength light such as ultraviolet light or deep ultraviolet light (in this embodiment, high-luminance ArF excimer laser light), and beam shape changing means 2 for transforming the illumination light from the light source 1 into a desired beam shape. It further comprises an optical integrator 3 having a plurality of cylindrical lenses or small lenses disposed two-dimensionally, and a stop member 4 having interchangeable stops which can be selectively interchanged by using interchanging means (not shown), and being disposed adjacent to the position of secondary light sources as produced by the optical integrator 3. The optical system further comprises a condenser lens 5 for collecting the illumination light passed through the stop member 4, and a blind means 7 having four movable blades, for example, and being disposed at a conjugate plane of the reticle 11 to determine a desired illumination range on the reticle 11 surface. It further comprises an imaging lens 8 for projecting the illumination light having been determined by the blind 7, into a predetermined shape, and a deflection mirror 9 for reflecting the illumination light, from the imaging lens 9, toward the reticle 11 direction.

The operation for projecting, in a reduced scale, the pattern of the reticle 11 onto the wafer 13 surface by using the stepper of the structure described above, will be explained.

First, the illumination light emitted from the light source 1 is transformed by the beam shape changing means 2 into a predetermined shape and, after this, it is projected onto the optical integrator 3. In response, adjacent to the light exit surface of the integrator, a plurality of secondary light sources are produced. The illumination light from these secondary light sources pass through the stop member 4 and are collected by the condenser lens 5. Then, after being defined into a predetermined shape by means of the blind 7, the light is transmitted through the imaging lens 8 and is reflected by the deflection mirror 9. Subsequently, the light passes the pattern of the reticle 11 and it enters the projection optical system 12. The light passes through the projection optical system 12, by which the reticle pattern is projected upon the surface of the wafer 11 while being reduced into a predetermined size. The wafer exposure is thus performed.

The structure of the projection optical system 12 having an optical unit with a diffractive optical element 22 according to the first embodiment, will be described below. FIG. 2 is a sectional view of a portion of the projection optical system 12 of FIG. 1. There is a diffractive optical element 22 fixedly mounted inside a barrel 21. Also, there are lenses 20 and 24 fixedly disposed above and below the diffractive optical element 22.

The diffractive optical element 22 is a single unit having a function equivalent to a combination of plural lenses being accumulated, and it serves to reduce aberration of the projection optical system 12, particularly, chromatic aberration thereof.

Namely, with the insertion of the diffractive optical element 22 into the projection optical system 12, production of aberration can be reduced to a minimum while using a decreased number of optical lenses of the projection optical system 12.

Figure 3A:
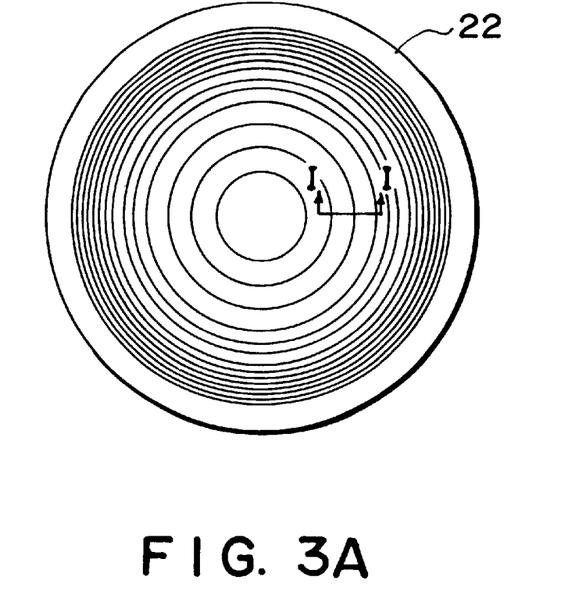
FIGS. 3A and 3B are schematic views of an optical unit according to an embodiment of the present invention.
Figure 3B:
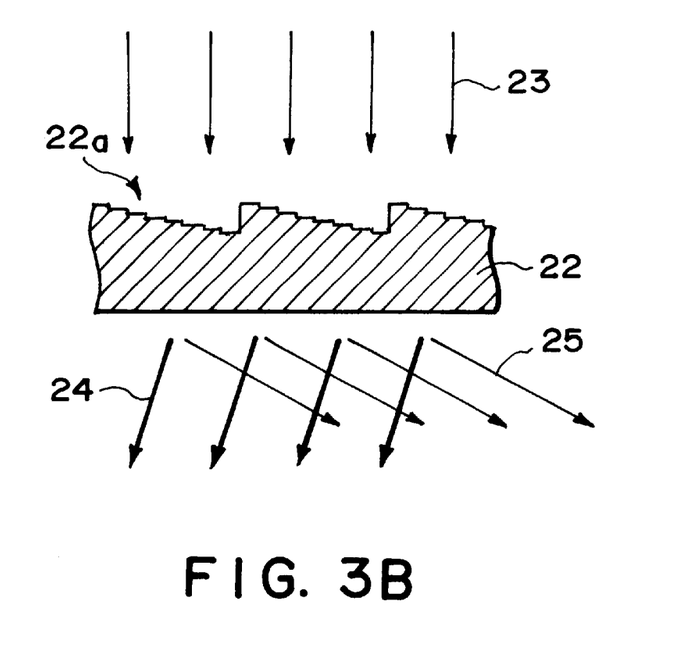

Next, details of the diffractive optical element 22 will be explained. FIG. 3A is a plan view of the diffractive optical element 22, and FIG. 3B is a fragmentary sectional view taken on a line I—I in FIG. 3A.

As shown in FIG. 3A, the diffractive optical element 22 is formed into a disk-like shape to be fitted into the inside diameter of the barrel 21. Further, as shown in FIG. 3B, there is a diffraction grating surface 22a of small step-like sectional shape formed on the diffractive optical element.

Thus, the diffractive optical element is a binary type optical element with a diffraction grating surface 22a which can be produced by forming small surface steps (level differences). Through the function of these small surface steps, the diffractive optical element operates to diffract light rays 23 incident thereon, at a desired deflection angle.

The diffractive optical element 22 can be produced by microprocessing a disk-like substrate, mainly consisting of quartz, on the basis of a photolithographic process and a dry etching process, used in the semiconductor manufacturing procedure. The diffraction grating surface 22a thereof is formed into such a shape that an idealistic element shape (blazed shape) as depicted in FIG. 3B is approximated by a step-like shape. Here, the height (level difference) of each individual step in the step-like section is about 40–60 nm.

A diffraction pattern on the diffraction grating surface 22a can be produced by patterning the surface of a disk-like substrate on the basis of photolithography and dry etching. In order to provide a diffraction pattern with a step-like shape such as shown in FIG. 3B, patterning operations of times corresponding to the number of surface steps are necessary. When a diffraction pattern with eight steps (levels) such as shown in FIG. 3B is to be produced, three times patterning operations are necessary. Here, if a disk-like substrate which is a raw material for the diffractive optical element 22 is relatively large in size, the whole range may not be exposed through a single exposure operation. Thus, the element surface may be divided concentrically into plural zones, and three times patterning operations may be performed with respect to each of the zones.

As shown in FIG. 3B, the light rays 23 incident on the diffractive optical element 22 are diffracted thereby at a desired deflection angle, so that light rays 24 (i.e., first order diffraction light) to be used for the image pickup are produced. Here, most of the incident light rays 23 are diffracted as desired first order diffraction light. However, there are unwanted light rays 25 produced by diffraction, which advance in a direction different from the advancement direction of the light rays 24.

The light rays 25 are those rays which are produced in relation to the small surface steps (level differences) of the binary type optical element. If the diffraction grating surface 22a of the diffractive optical element 22 is formed into a completely idealistic shape, there occurs no such unwanted light ray 25. However, when the diffraction grating surface 22a is approximated by use of a small step-like structure, unwanted light rays 25 are produced. In accordance with simulations based on design values of the diffraction grating surface 22a of the diffractive optical element 22 as well as the wavelength of light rays projected thereto from the light source 1, for example, the advancement direction (diffraction angle) of the first order diffraction light (light rays 24) and also the advancement direction (diffraction angle) of the unwanted light rays 25, can be detected.

Next, the structural members provided in the barrel 21, for absorbing the unwanted light 25, will be explained.

As shown in FIG. 2, upon the inside circumferential surface 21a of the barrel 21 between the diffractive optical element 22 and the optical lens 24, there is a light absorbing structure (attenuating means) 26 extending over the entire circumference. Disposed close to the light absorbing structure 26 and outside the barrel 21 is cooling means 27 which extends over the entire circumference.

Figure 4:
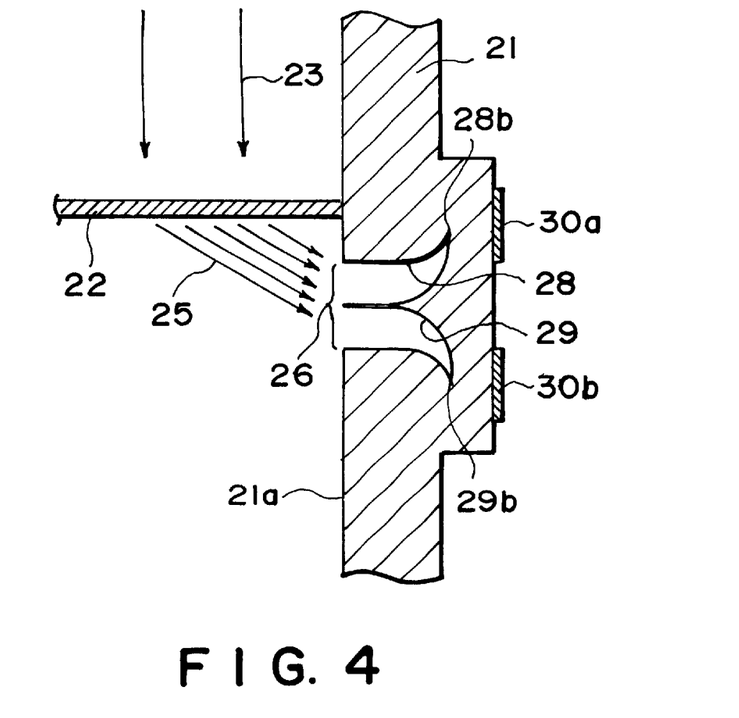
FIG. 4 is a schematic and sectional view, showing in enlargement a portion of a reduction optical system according to an embodiment of the present invention.

FIG. 4 shows details of the light absorbing structure 26 in the first embodiment. The light absorbing structure 26 comprises two recesses 28 and 29 formed close to each other and each having a horn-like sectional shape. Each of these horn-like recesses 28 and 29 is formed to extend over the entire inside circumference of the barrel 21. The positions of the recesses 28 and 29 are just below the diffractive optical element 22, and they are on an extension line of the advancement direction of the unwanted light 25.

Figure 5:
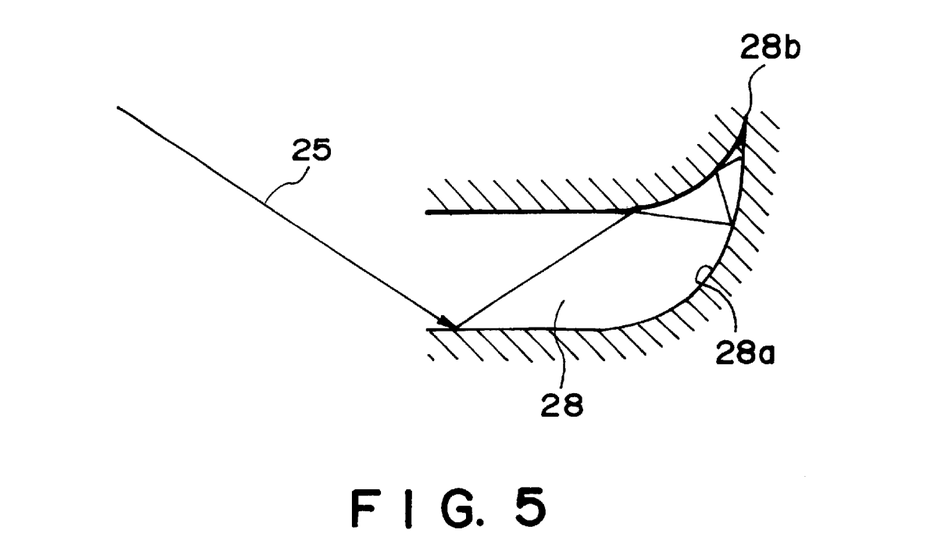
FIG. 5 is a schematic and sectional view, showing details of an optical absorption structure according to an embodiment of the present invention.

The barrel is made of metal, for example, and the inner wall surfaces of the recesses 28 and 29 are formed as metal reflection surfaces. FIG. 5 is a sectional view, showing the shape of the recess 28 in detail. The recess 28 is formed with a horn-like sectional shape. Thus, the inner wall surface 28a of the recess 28 is bent upwardly, as viewed in FIG. 4, and its free end portion 28b is converged toward a particular region.

FIG. 5 illustrates that the unwanted light 25 entering the recess 28 is reflected within the recess 28. In this manner, the unwanted light rays 25 are reflected by the inner wall surface 28a of the recess 28 toward the bottom of the recess, and they are converged to the free end portion 28b at the bottom of the recess 28.

Thus, with the provision of the horn-like recess 28 disposed in the advancement direction of the unwanted lights 25, the unwanted lights can be converged toward a particular convergence region through multiple reflection inside the recess 28, and they can be absorbed thereby.

As shown in FIG. 4, there is cooling means 27 comprising Peltier elements 30a and 30b which are provided outside the barrel 21 and in close proximity to the free end portions 28b and 29b of the recesses 28 and 29. These Peltier elements 30a and 30b function to absorb heat on the basis of the Peltier effect.

By disposing the Peltier elements 30a and 30b in close proximity to the free end portions 28b and 29b of the recesses 28 and 29, any heat generation to be produced at the free end portions 28b and 29b in response to the absorption of unwanted light 25, can be cooled from the outside of the barrel 21. As a result of it, any deformation of the barrel 21 due to heat generation at the recesses 28 and 29 can be prevented and, therefore, degradation of optical performance of the projection optical system 12 due to such deformation of the barrel 21 can be avoided.

In accordance with the first embodiment of the present invention as described above, light rays 23 incident on the diffractive optical element 22 are diffracted into desired first order diffraction light (light rays 24), while unwanted light rays 25 produced and diffracted in a direction different from the light rays 24 are absorbed by horn-like recesses 28 and 29 which are provided in the advancement direction of the unwanted light rays 25. Through the absorption of the unwanted light 25, it can be removed from the projection optical system 12.

As a result, the light rays 25 which may cause irregular reflection within the projection optical system 12 can be removed and, therefore, production of ghost or flare can be prevented. The uniformness of the light flux to be projected on the wafer 13 can thus be improved. Therefore, with desired light rays 24 passing through the projection optical system 12, a pattern of desired shape can be produced on the wafer 13 at a high precision. The reliability of a device to be produced by the stepper of FIG. 1 can be improved.

Further, with the provision of cooling means having Peltier elements 30a and 30b in close proximity to the recesses 28 and 29, the recesses 28 and 29 heated as a result of absorption of the light rays 25 can be cooled thereby. Thus, any deformation of the barrel 21 due to heat can be reduced, and degradation of the optical performance of the projection optical system 12 can be prevented.

Next, a second embodiment of the present invention will be described in conjunction with the drawings. Also, in the second embodiment, a description will be made of an example of a stepper having an optical unit according to the present invention.

Major structures of the stepper and the projection optical system, as an optical unit, of the second embodiment, are essentially the same as those of the first embodiment. The second embodiment differs from the first embodiment with respect to the light absorbing structure 26 and the cooling means 27 of FIG. 2. These components will be mainly described below. In the drawings which illustrate the second embodiment, the structural elements substantially corresponding to those of the first embodiment are denoted by like numerals.

Figure 6:
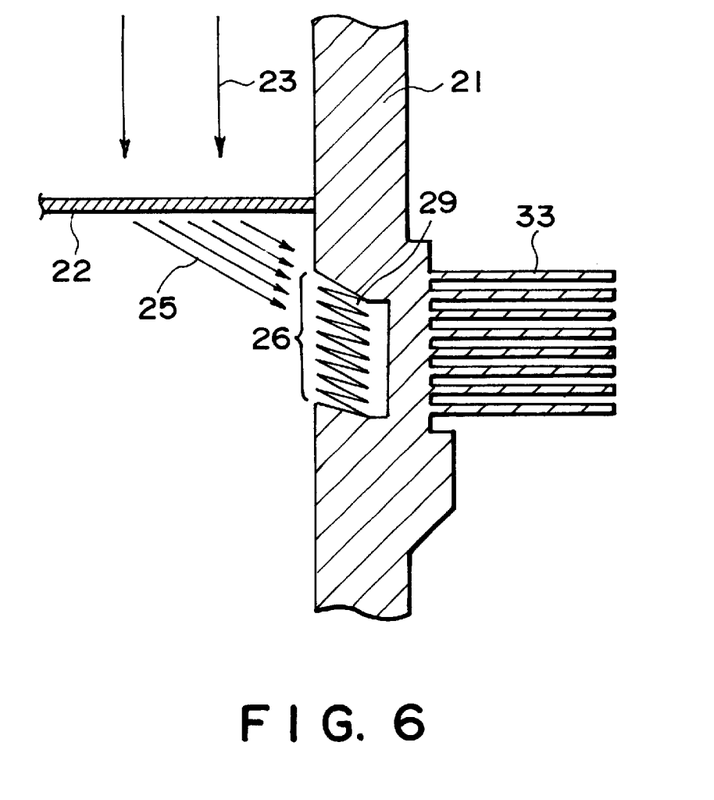
FIG. 6 is a schematic and sectional view, showing in enlargement a portion of a reduction optical system according to another embodiment of the present invention.

FIG. 6 shows details of a light absorbing structure 26 according to the second embodiment. The light absorbing structure 26 comprises a groove-like member 31 having a wedge-like sectional shape and being formed to extend over the entire circumference of the inside circumferential surface 21a of the barrel 21. The groove-like member 31 has its tip ends formed with sharp edges, and it is held fixed at the bottom.

Figure 7:
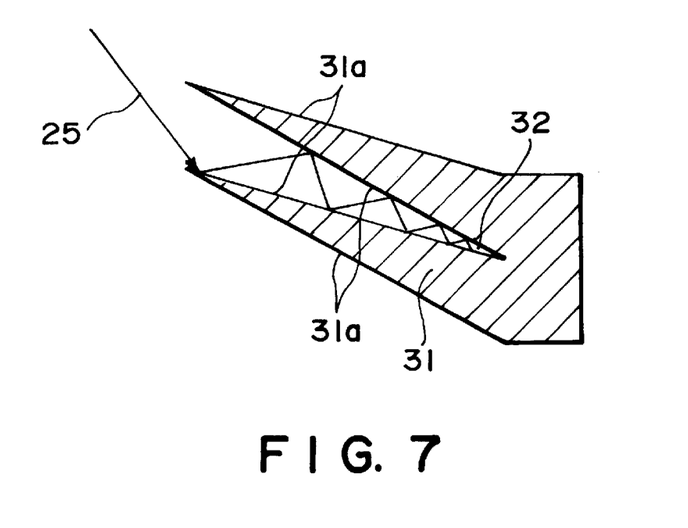
FIG. 7 is a schematic and sectional view, showing details of an optical absorption structure according to another embodiment of the present invention.

FIG. 7 is an enlarged sectional view of the groove-like member 31. In this embodiment, the groove-like member 31 is made of a metal material, and the side faces 31a of the groove-like member 31 provide metal reflection surfaces. By forming the side faces 31a as reflection surfaces in this manner, as shown in FIG. 7, when unwanted light rays 25 are incident on the light absorbing structure 26 comprising the groove-like member 31, the light rays 25 are repeatedly reflected and are directed to the bottom 32 of each groove. Thus, the light rays can be absorbed at the bottom 32.

As shown in FIG. 6, disposed on the outside circumference of the barrel 21 is a fin-like heat radiation plate 33 which is mounted in close proximity to the light absorbing structure 26 comprising the groove-like member 31. The heat radiation plate 33 is formed to extend through the entire outside circumference of the barrel 21. It functions as cooling means 27 for cooling the wedges of the groove-like member 31 as being heated by the absorption of the light rays 25.

Namely, the heat from the groove-like member 31 being heated by absorption of light rays 25 is transferred to the heat radiation plate 33 through the barrel 21. Then, it can be radiated effectively, by means of the heat radiation plate 33 which is formed with fins and thus with an enlarged surface area.

In accordance with the second embodiment of the present invention as described above, light rays 23 incident on the diffractive optical element 22 are diffracted into desired first order diffraction light (light rays 24), while unwanted light rays 25 produced and diffracted in a direction different from the light rays 24 are absorbed by the light absorbing structure 26 which has a groove-like member 31 and which is provided in the advancement direction of the unwanted light rays 25. Through the absorption of the unwanted light 25, it can be removed from the projection optical system 12.

As a result, the light rays 25 which may cause irregular reflection within the projection optical system 12 can be removed and, therefore, production of ghost or flare can be prevented. The uniformness of the light flux to be projected on the wafer 13 can thus be improved. Therefore, with desired light rays 24 passing through the projection optical system 12, a pattern of desired shape can be produced on the wafer 13 at a high precision. The reliability of a device to be produced by the stepper of FIG. 1 can be improved.

Further, with the provision of the fin-like heat radiation plate 33 outside the barrel 21, the groove-like member 31 heated as a result of absorption of the light rays 25 can be cooled thereby. Thus, any deformation of the barrel 21 due to heat can be reduced, and degradation of the optical performance of the projection optical system 12 can be prevented.

The heat radiation plate 33 may be used also in the first embodiment as the cooling means 27. The Peltier elements 30a and 30b may be used also in the second embodiment as the cooling means 27. Further, in the first and second embodiments, the cooling means 27 may be structured into a water cooling system, with the addition of piping means in proximity to the optical absorption means 26, for example.

Figure 8:
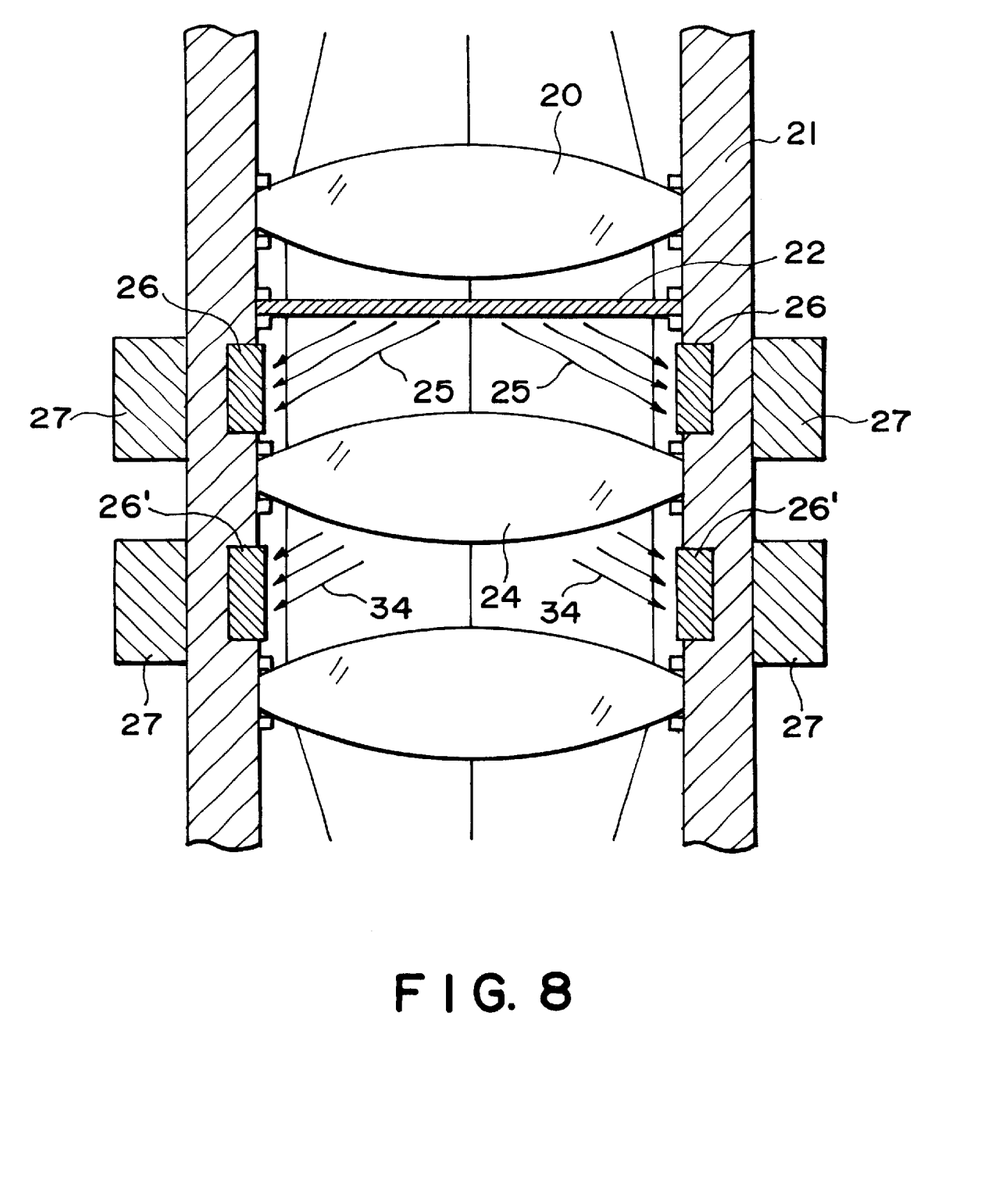
FIG. 8 is a schematic and sectional view, showing a portion of a reduction optical system according to a further embodiment of the present invention.

Further, as shown in FIG. 8, an additional optical absorption structure 26' may be provided below the lens 24. With the provision of such optical absorption means 26' at that position, even if unwanted light rays 34 being diffracted in directions other than the direction of the light rays 25 pass through the optical lens 24, the light rays 24 passing through the optical lens 24 and being deflected (refracted) toward the inside circumferential surface 21a of the barrel 21 can be removed thereby. Also, on that occasion, additional cooling means 27' may be provided outside the barrel 21, in close proximity to the optical absorption structure 26', by which the optical absorption structure 26' heated through the absorption of the light rays 33 can be cooled. In the manner as described, simulations may be made on the basis of the wavelength of the light source 1 as well as the design values of the diffractive optical element 22 and of the optical lenses 23 and 24, and the optical absorption means 26 may be provided in the portion where incidence of unwanted light rays is expected. With this arrangement, these unwanted light rays can be absorbed effectively.

Next, an embodiment of a semiconductor device manufacturing method which uses a stepper having been described with reference to FIG. 1, will be explained.

Figure 10:
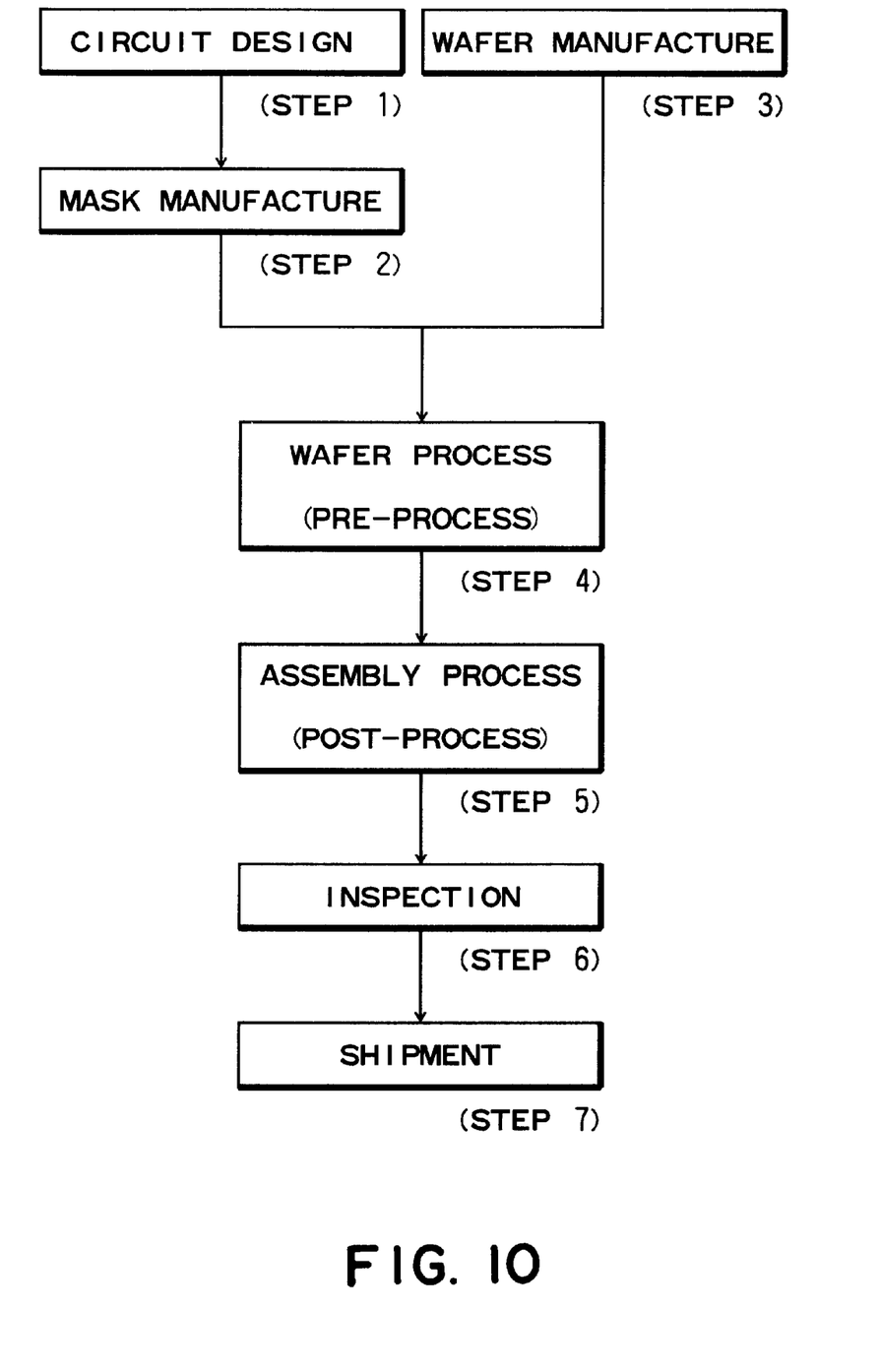
FIG. 10 is a flow chart of semiconductor device manufacturing processes, using a stepper according to the present invention.

FIG. 10 is a flow chart of a procedure for the manufacture of microdevices such as semiconductor chips (e.g., ICs or LSIs), liquid crystal panels, or CCDs, for example.

Step 1 is a design process for designing a circuit of a semiconductor device. Step 2 is a process for making a mask on the basis of the circuit pattern design. Step 3 is a process for preparing a wafer by using a material such as silicon. Step 4 is a wafer process (called a pre-process) wherein, by using the so prepared mask and wafer, circuits are practically formed on the wafer through lithography. Step 5 subsequent to this is an assembling step (called a post-process) wherein the wafer having been processed by step 4 is formed into semiconductor chips. This step includes an assembling (dicing and bonding) process and a packaging (chip sealing) process. Step 6 is an inspection step wherein an operation check, a durability check and so on for the semiconductor devices provided by step 5, are carried out. With these processes, semiconductor devices are completed and they are shipped (step 7).

Figure 11:
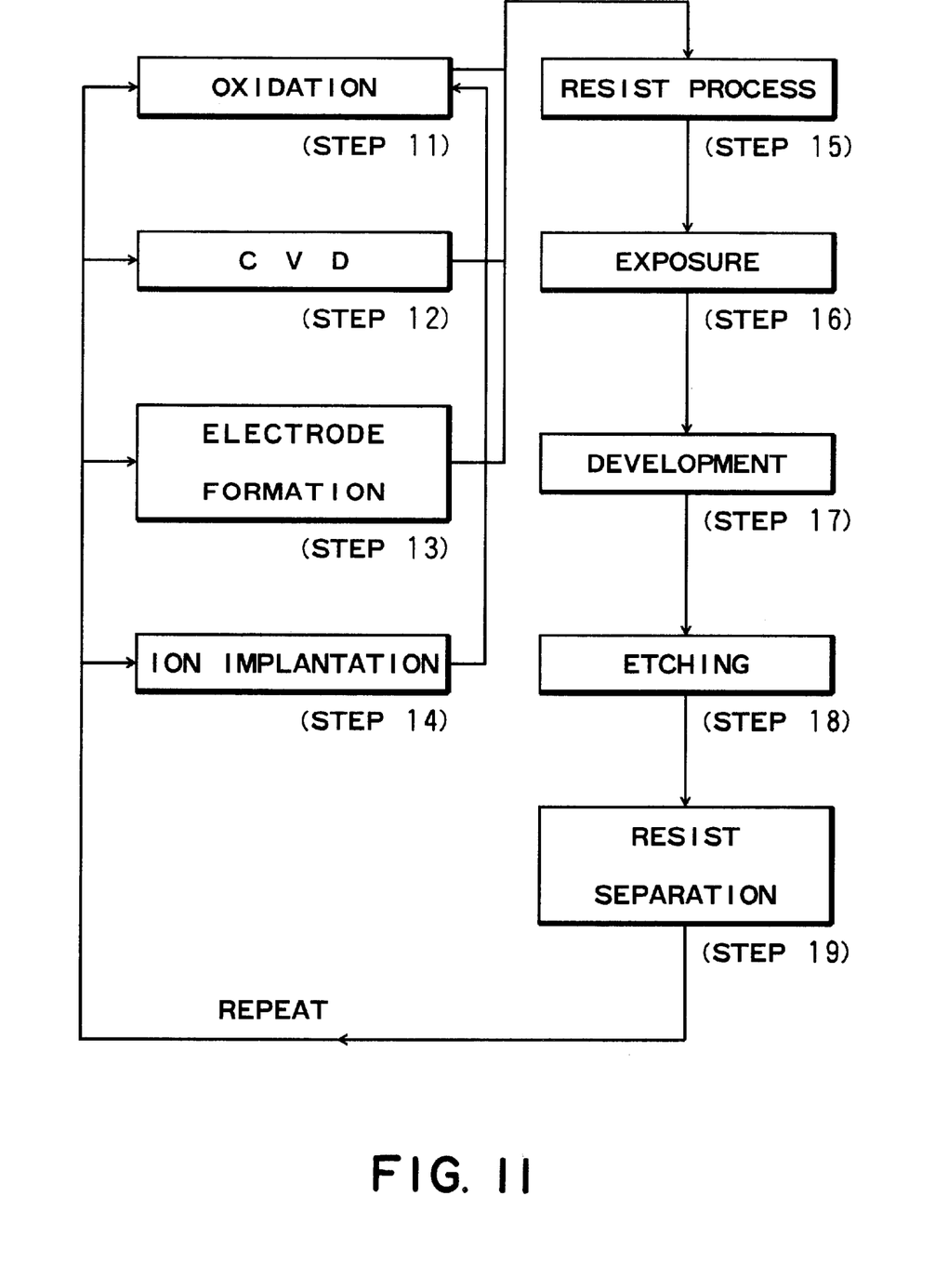
FIG. 11 is a flow chart for explaining details of a wafer process in the procedure of FIG. 10.

FIG. 11 is a flow chart showing details of the wafer process.

Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the water. Step 16 is an exposure process for printing, by exposure, the circuit pattern of the mask on the wafer through the exposure apparatus described above. Step 17 is a developing process for developing the exposed wafer Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

When this manufacturing method is used, at step 16, uniform illumination light having various optical aberrations corrected can be projected to the wafer surface, with use of the stepper according to this embodiment of the present invention and with a large latitude. Therefore, a large-integration semiconductor device can be produced easily and stably. Here, it is to be noted that this manufacturing method may be used for the diffractive optical element 25 itself, not only for production of a semiconductor device.

While the first and second embodiments have been described with reference to examples of a stepper as an optical instrument having a diffractive optical element 22, the present invention is not limited to this. For example, as shown in FIG. 9, the optical unit may be used in a portion of lenses constituting a television camera (CCD camera).

Figure 9:
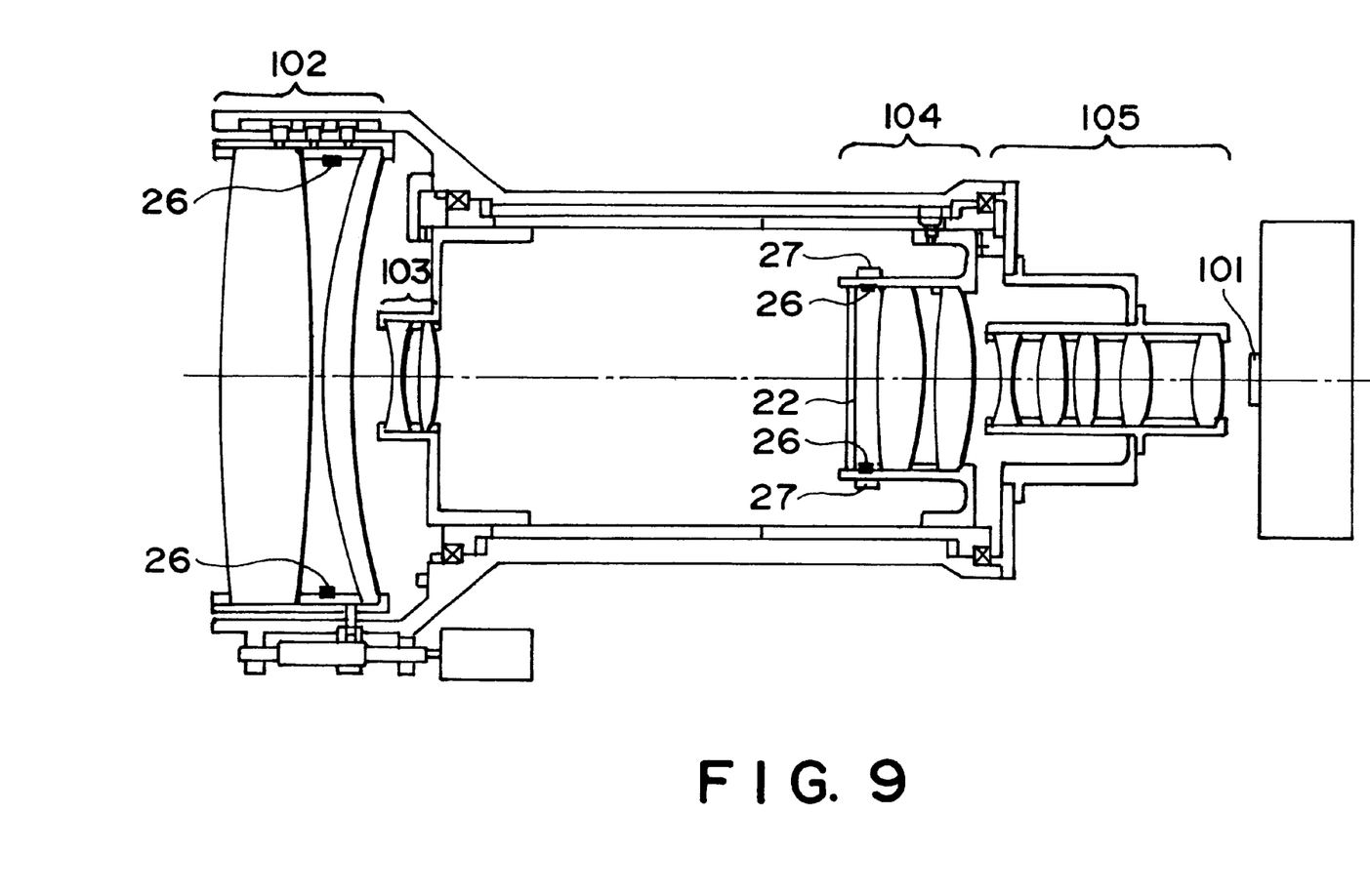
FIG. 9 is a schematic and sectional view of a television camera according to an embodiment of the present invention.

In the TV camera shown in FIG. 9, there are lens groups 102–105 before a photoelectric converting element (CCD) 101, that is, on the target side. Here, denoted at 102 is a focusing lens group, and denoted at 103 is a variation lens group. Denoted at 104 is a compensator lens group, and denoted at 105 is a relay lens group.

The focusing lens group 102 is held by a focusing lens barrel, and it can be moved along the optical axis direction. With this movement of the focusing lens group, the focusing operation is performed. Also, through movements of the variation lens group 103 and the compensator lens group 104, the zooming operation is performed. An image of a subject to be photographed is imaged on the photoelectric converting element 101 after the relay lens group 105, by which a video image is produced.

In the TV camera of the structure described above, the diffractive optical element 22 according to the present invention is fixedly mounted in front of the compensator lens group 104, for example. This enables that a portion of a lens group, which should otherwise be required for suppressing the production of aberration, can be substituted by the diffractive optical element 22. By incorporating the diffractive optical element 22 into the optical system of the television camera, the total number of lenses of the optical system as a whole can be reduced. This accomplishes a TV camera of smaller size and with a simple structure. Also, the manufacturing cost can be lowered significantly.

The light absorbing structure 26 of the present invention is provided on the inside surface of the barrel, for holding the compensator lens group 104, and in proximity to the diffractive optical element 22. Also, there is cooling means 27 at the outside circumference of the barrel. Unwanted light rays diffracted by the diffractive optical element 22 and directed to the light absorbing structure 26 are absorbed thereby. The light absorbing structure 26 being heated by absorption of light can be cooled by the cooling means 27.

Also, there is a light absorbing structure 26 disposed between two lenses, constituting the focusing lens group 102. In this manner, the light absorbing structure 26 is operable not only to directly absorb unwanted light rays produced by the diffractive optical element 22 but also to absorb unwanted light rays from the lens to remove them. Also, on that occasion, cooling means 27 may desirably be provided in close proximity to the light absorbing structure 26. Here, is to be noted that the structure of the television camera described above may be applied to a photographic camera using an ordinary photosensitive material.

Next, a third embodiment of the present invention will be described in conjunction with the drawings. Also, in the third embodiment, a description will be made of an example of a stepper having an optical unit according to the present invention.

Major structures of the stepper and the projection optical system, as an optical unit, of the third embodiment, are essentially the same as those of the second embodiment. The third embodiment differs from the second embodiment with respect to the light absorbing structure 26 shown in FIG. 6, and a description will be made mainly to this point of the structure.

Figure 12:
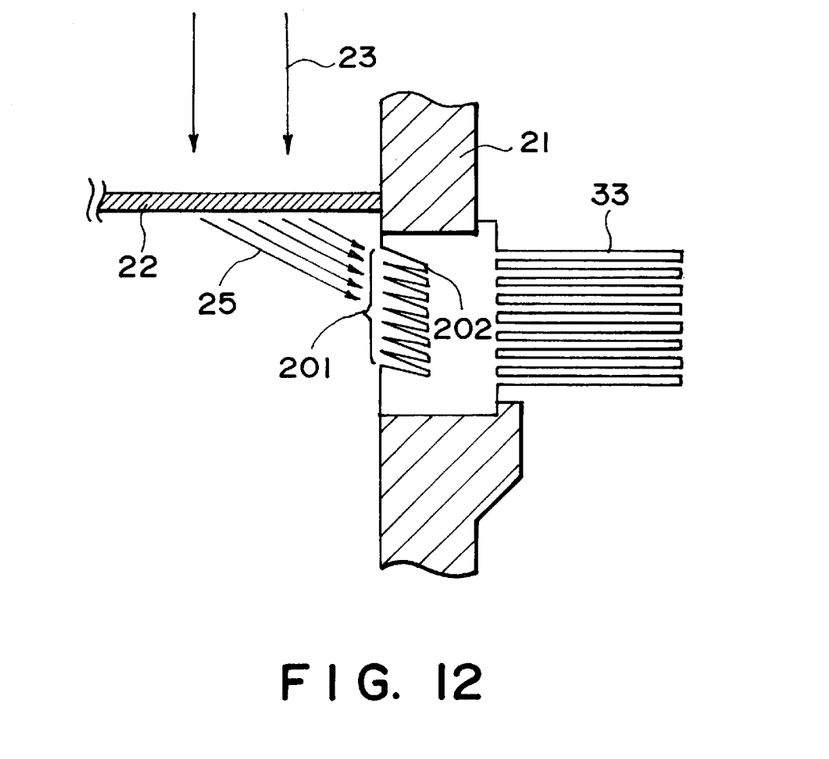
FIG. 12 is a schematic and sectional view, showing in enlargement a portion of a reduction optical system according to a further embodiment of the present invention.

FIG. 12 shows details of a light absorbing structure 26 according to the third embodiment. The light absorbing structure 26 comprises a groove-like member 201 of approximately rectangular sectional shape and being formed to extend substantially through the entire circumference of the inside circumferential surface 21a of the barrel 21. The groove-like member 201 has bottoms 202 each being defined by a surface having a certain area, not by a sharp edge.

Figure 13:
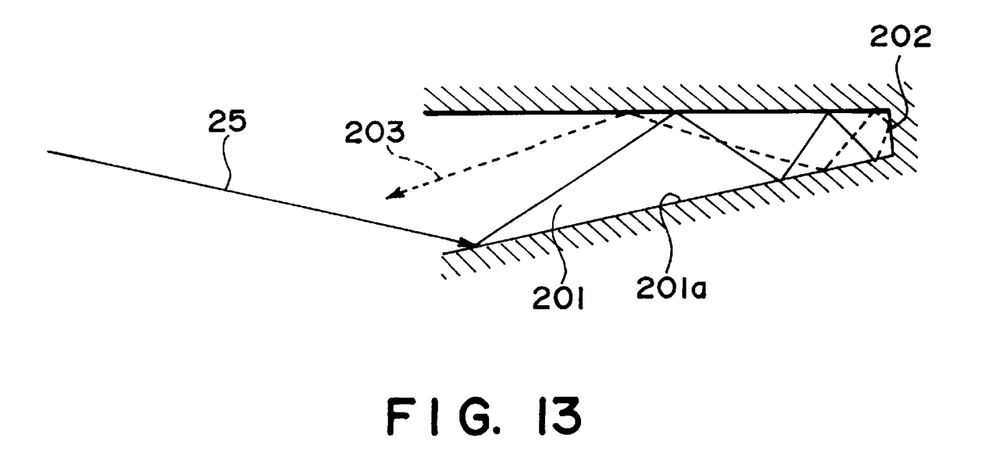
FIG. 13 is a schematic and sectional view, showing details of an optical absorption structure according to a further embodiment of the present invention.

FIG. 13 is a sectional view showing the groove-like member 201 in enlargement. In this embodiment, the groove-like member 201 is made of a metal material, and the side faces 201a of the groove-like member 201 provide metal reflection surfaces.

The reflection factor of the metal reflection surface is made low with respect to the wavelength of incident light 23. This can be done, for example, by depositing a desired optical film thereof or by roughly processing the same during a cutting and processing operation, for example. On that occasion, the light rays 25 incident thereupon are attenuated through multiple reflection at the inside surface of the groove-like member 201, but light rays impinging on the bottom 202 may then be multiple-reflected and may emerge from the light absorbing structure as light rays 23. Even on that occasion, however, they can be attenuated to a level that does not influence the ghost or flare, for example.

In this embodiment, the width of each groove of the groove-like member 201 decreases toward its bottom 202. However, this width may be kept substantially constant, toward the bottom 201. Also, the bottom 202 may have a curved surface, not a flat surface.

Further, also in the first and second embodiments, even when a portion of the converged light rays leaks from the optical absorption structure, there occurs no inconvenience if the light rays are sufficiently attenuated to a level that does not cause ghost or flare.

While the invention has been described with reference to the structures disclosed herein, it is not confined to the details set forth and this application is intended to cover such modifications or changes as may come within the purposes of the improvements or the scope of the following claims

What is claimed is:

1. An optical unit, comprising:
    an optical element for propagating incident light toward a predetermined direction;
    a barrel for supporting said optical element; and
    attenuating means including a plurality of grooved portions, for attenuating, through multiple reflection, at least a portion of light emitted from said optical element toward a direction different from the predetermined direction, wherein (i) said attenuating means includes two recesses each having a horn-like section shape, said two recesses being bent in directions away from each other, (ii) two of the grooved portions are provided on an inside wall of said barrel and at positions shifted in an optical axis direction of said optical element, (iii) one of the two grooved portions, which is provided at a light entrance side of said optical element, is bent toward a direction of incidence of the light, and (iv) the other of the two grooved portions, which is provided at a light exit side of said optical element, is bent toward a direction of emission of the light.

2. An optical unit according to claim 1, further comprising cooling means for cooling said attenuating means.

3. An optical unit according to claim 2, wherein said cooling means comprises an air cooling system.

4. An optical unit according to claim 2, wherein said cooling means comprises a water cooling system.

5. An optical unit according to claim 2, wherein said cooling means comprises a Peltier device.

6. An optical unit according to claim 1, wherein said attenuating means converges the light toward a predetermined region through multiple reflection.

7. An optical unit according to claim 1, wherein said optical element comprises a diffractive optical element.

8. An optical unit according to claim 7, wherein said diffractive optical element has a diffraction pattern formed with a step-like shape.

9. An optical unit according to claim 7, wherein the light deflected toward the predetermined direction is a positive first order or negative first order diffraction light of the light deflected by said optical element.

10. An optical unit according to claim 1, wherein said optical element is fixedly or movably held in a barrel, and said attenuating means is provided along the whole inside peripheral surface of said barrel.

11. An optical unit according to claim 1, wherein said optical unit has a plurality of light attenuating means.

12. An optical instrument, having an optical unit as recited in claim 1, for projecting light to a photosensitive material through said optical unit.

13. An optical instrument, having an optical unit as recited in claim 1, for projecting light to a photoelectric converting element through said optical unit.

14. An exposure apparatus, comprising:

an illumination optical system;

a projection optical system; and an optical unit as recited in claim 1, wherein said optical unit is incorporated into one of said illumination optical system and said projection optical system as a component thereof, so that a predetermined pattern is projected onto a surface to be illuminated, whereby the pattern is printed onto the surface.

15. A device manufacturing method, comprising the steps of:

applying a photosensitive material to a wafer;

exposing the wafer having the photosensitive material applied thereto, with a device pattern, by use of an exposure apparatus as recited in claim 14; and developing the exposed wafer.

* * * * *

UNITED STATES PATENT AND TRADEMARK OFFICE
CERTIFICATE OF CORRECTION

PATENT NO. : 6,606,195 B2
DATED : August 12, 2003
INVENTOR(S) : Toshihik Tsuji

It is certified that error appears in the above-identified patent and that said Letters Patent is hereby corrected as shown below:

Column 1,
Line 34, "another" should read -- an --.
Line 35, "optical instrument having such an optical unit as decribed" should read -- improved optical unit by which such ghost --.
Line 36, "above" should read -- or flare can be reduced or avoided --.
Line 38, the second occurrence of "optical" should read -- an optical --.

Column 5,
Line 9, "three times patterning" should read -- three-time-patterning --.

Column 6,
Line 67, "being" should read -- is --.

Column 8,
Line 51, "wafer" should read -- wafer. --.

Column 10,
Line 2, "being" should read -- is --.

Signed and Sealed this

Twenty-fourth Day of August, 2004

JON W. DUDAS
*Director of the United States Patent and Trademark Office*